(12) United States Patent
Walsh

(10) Patent No.: US 6,720,958 B1
(45) Date of Patent: Apr. 13, 2004

(54) LOW POWER SINGLE-ENDED VOLTAGE AMPLIFIER WITH ADJUSTABLE GAIN AND OFFSET FOR SILICON MICRO DISPLAYS

(75) Inventor: Hugh M Walsh, Sunnyvale, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 714 days.

(21) Appl. No.: 09/628,469

(22) Filed: Jul. 31, 2000

(51) Int. Cl.$^7$ ................................................. G09G 5/00

(52) U.S. Cl. .................... 345/204; 345/87; 345/211; 330/252

(58) Field of Search ............................... 345/85, 87, 98, 345/211, 55, 204; 330/252, 254, 257, 777, 778, 788

(56) References Cited

U.S. PATENT DOCUMENTS

| | | | | |
|---|---|---|---|---|
| 5,404,333 A | * | 4/1995 | Mehta | ......................... 365/208 |
| 5,550,495 A | * | 8/1996 | Fotouhi | ..................... 327/103 |

FOREIGN PATENT DOCUMENTS

| | | | |
|---|---|---|---|
| EP | 0953959 | 12/1998 | ............ G09G/3/34 |

OTHER PUBLICATIONS

Phillip E. Allen & Michael B. Terry; "The Use of Current Amplifiers for High Performance Voltage Applications"; IEEE Journal of Solid–State Circuits, vol. SC–15, No. 2, Apr. 1980; pp. 155–162.

Rudy J. Van De Plassche; "A Wide–Band Monolithic Instrumentation Amplifier"; IEEE Journal of Solid–State Circuits, vol. SC–10, No. 6, Dec. 1975; pp. 424–431.
Universal Current–Mode Analogue Amplifiers, pp. 147–151.

* cited by examiner

*Primary Examiner*—Dennis-Doon Chow

(57) ABSTRACT

A liquid crystal pixel driving technique is described that uses a voltage amplifier employing operational transconductance amplifiers and current mirrors to increase LC (Liquid Crystal)-based micro display contrast fidelity and lower production costs. The voltage amplifier has a current follower coupled between a voltage-to-current converter and a voltage buffer. The voltage amplifier employs operational transconductance amplifiers and at least one current mirror to achieve a fixed output swing of an output voltage from the voltage buffer based upon an input swing of a single-ended input voltage to the voltage-to-current converter. A marginal change in the output voltage from the voltage buffer is substantially linear and proportional to a marginal change in the input voltage input to the voltage-to-current converter. For one embodiment of the voltage amplifier, gain and voltage offset of the output voltage can be adjusted by changing the values of two resistors. For one embodiment of the voltage amplifier, the voltage-to-current converter and the current follower together use two operational transconductance amplifiers and two current mirrors. For an alternative embodiment of the voltage amplifier, the voltage-to-current converter and the current follower together use three operational transconductance amplifiers and a current mirror. Overall, the voltage amplifier can provide a 3 dB bandwidth which is independent of the gain. Moreover, power dissipation of the AC signal path is independent of the gain.

6 Claims, 5 Drawing Sheets

LOW POWER SINGLE-ENDED VOLTAGE AMPLIFIER WITH ADJUSTABLE GAIN AND OFFSET FOR SILICON MICRO DISPLAYS

BACKGROUND OF THE INVENTION

1. Field of the Invention

The present invention relates to liquid crystal-based video and graphics display devices, and, in particular, to voltage amplifiers for such devices.

2. Description of the Related Art

A substantial need exists for various types of video and graphics display devices with improved performance and lower cost. For example, a need exists for miniature video and graphics display devices that are small enough to be integrated into a helmet or a pair of glasses so that they can be worn by the user. Such wearable display devices would replace or supplement the conventional displays of computers and other devices. In particular, wearable display devices could be used instead of the conventional displays of laptop and other portable computers. Potentially, wearable display devices can provide greater brightness, better resolution, larger apparent size, greater privacy, substantially less power consumption and longer battery life than conventional active matrix or double-scan liquid crystal-based displays. Other potential applications of wearable display devices are in personal video monitors, in video games and in virtual reality systems.

Miniaturized displays based on cathode-ray tubes or conventional liquid crystal displays have not been successful in meeting the demands of wearable displays for low weight and small size. Of greater promise is a micro display of the type described in U.S. Pat. No. 5,596,451 of Handschy et al. (digital pixel driver) and in European patent application no. 98122934.7 (publication no. EP 0 953 959 A2), of Walker et al. (analog pixel driver), the disclosures of which are incorporated into this disclosure by reference. This type of micro display includes a reflective spatial light modulator that uses a liquid crystal (LC) material as its light control element. Typically, a ferroelectric liquid crystal (FLC) material is used as the light control element.

To drive the pixels of the spatial light modulator, there is a need for an inexpensive low-power circuit that amplifies a single-ended voltage input and shifts the offset of the output to a stable voltage. Preferably, such a circuit would permit one to adjust the gain and offset values by changing the values of only two resistors. Furthermore, the overall amplifier would have a 3 dB bandwidth that is independent of the gain. Additionally, the power dissipation of the AC signal path would be independent of the gain.

Allen describes an elegant solution that has these properties. See P. Allen and M. Terry, "The Use of Current Amplifiers for High Performance Voltage Applications", IEEE Journal of Solid State Circuits, vol. SC-15, no. 2, pp. 155–162, April 1980. Allen uses a high-gain bipolar current amplifier with resistive feedback. However, the high-gain current amplifier Allen employs relies on base-current multiplication to achieve high gain. This is realizable in bipolar technology, but not in CMOS.

Van de Plassche describes an instrumentation amplifier that employs a voltage-to-current converter at the input stage and that is realizable in CMOS. See R. Van de Plassche, "A Wide-Band Monolithic Instrumentation Amplifier", IEEE Journal of Solid State Circuits, vol. SC-10, no. 6, pp 424–431, December 1975. The Van de Plassche implementation is not suitable for use to drive the pixels of the spatial light modulator, however, because it is optimized for a differential input and is designed to reject common-mode voltages. It is preferable to use a single-ended input to drive the pixels of the spatial light modulator. Moreover, when driving the pixels, it is preferable to control, not reject, the DC values and currents in the amplifier circuit.

Thus, it can be seen that modern liquid crystal pixel driving techniques impose contrast fidelity and production cost limits upon LC-based micro displays, and hinder the use of these micro displays in many applications.

Therefore, there is an unresolved need for an improved liquid crystal pixel driving technique that can increase LC-based micro display contrast fidelity and lower production costs.

SUMMARY OF THE INVENTION

A liquid crystal pixel driving technique is described that uses a voltage amplifier employing operational transconductance amplifiers and current mirrors to increase LC (Liquid Crystal)-based micro display contrast fidelity and lower production costs.

The voltage amplifier has a current follower coupled between a voltage-to-current converter and a voltage buffer. The voltage amplifier employs operational transconductance amplifiers and at least one current mirror to achieve a fixed output swing of an output voltage from the voltage buffer based upon an input swing of a single-ended input voltage to the voltage-to-current converter. A marginal change in the output voltage from the voltage buffer is substantially linear and proportional to a marginal change in the input voltage input to the voltage-to-current converter.

For one embodiment of the voltage amplifier, gain and voltage offset of the output voltage can be adjusted by changing the values of two resistors. At least one of these two resistors may be an off-chip resistor.

For one embodiment of the voltage amplifier, the voltage-to-current converter and the current follower together use two operational transconductance amplifiers and two current mirrors. For an alternative embodiment of the voltage amplifier, the voltage-to-current converter and the current follower together use three operational transconductance amplifiers and a current mirror.

For one embodiment, the voltage amplifier is used in an analog driver for at least one of the pixels of an array of pixels in a spatial light modulator. The spatial light modulator, in turn, can be used in a display device.

Overall, the voltage amplifier can provide a 3 dB bandwidth which is independent of the gain. Moreover, power dissipation of the AC signal path is independent of the gain.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–5. Those skilled in the art will readily appreciate that the detailed description given herein with respect to these figures is for explanatory purposes, however, because the invention extends beyond these limited embodiments.

Figure 1:
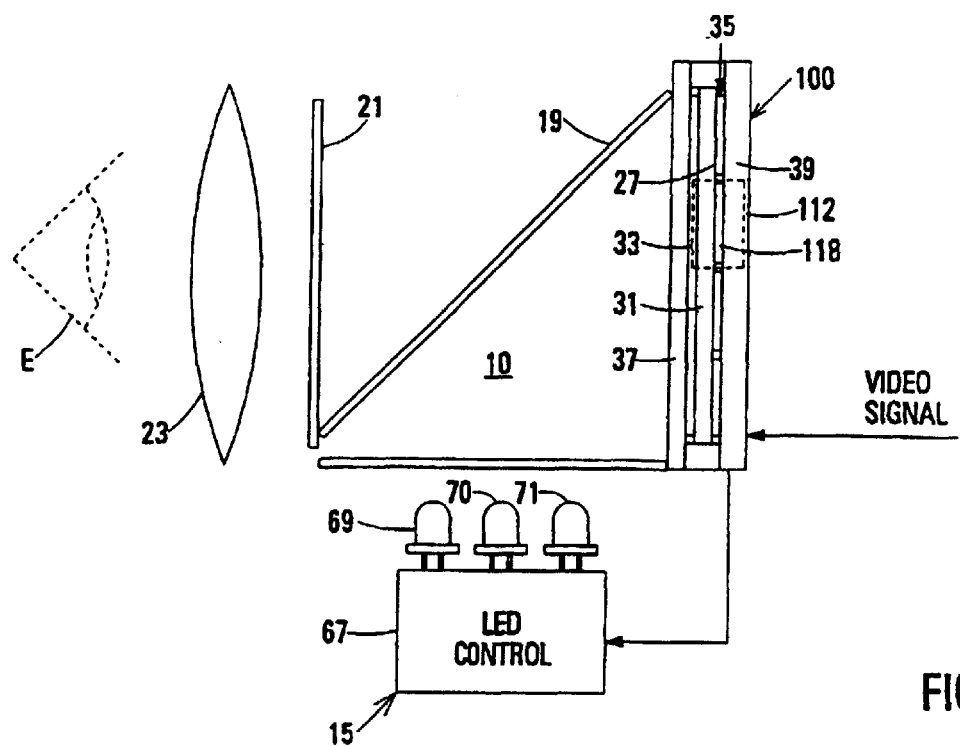
FIG. 1 shows the structure of a display device that incorporates the analog pixel driver circuitry according to the invention.

FIG. 1 shows the structure of the display device 10 that includes the reflective spatial light modulator 100 that employs single-ended voltage amplifiers to drive pixels according to the invention. Other principal components of the display device are the light source 15, the polarizer 17, the beam splitter 19, the analyzer 21 and the eyepiece 23.

The light source 15 is composed of the LED driver 67 that drives the LEDs 69–71. The LEDs are of different colors and are independently driven in a color display device. Fewer or more LEDs, or other light-emitting devices whose output can be rapidly modulated may alternatively be used as the light source 15. As a further alternative, a white light source and a light modulator may be used. The light modulator modulates the amplitude of the light output by the light source and, in a color display device, additionally modulates the color of the light output.

The light source 15 generates light that passes through the polarizer 17. The beam splitter 19 reflects a fraction of the polarized light from the polarizer towards the spatial light modulator 100. The reflective electrode 35 located on the surface of the substrate 39 of the spatial light modulator reflects a fraction of the incident polarized light. Depending on the electric field across the layer 31 of electro-optical material (the electro-optical layer), to be described below, the direction of polarization of the reflected light is either unchanged or is rotated through 90 DEG. The reflected light passes to the user's eye E through the beam splitter 19, the analyzer 21 and the eyepiece 23.

The eyepiece 23 focuses the light reflected by the reflective electrode 35 at the user's eye E. The eyepiece is shown as a single convex lens in FIG. 1. A more complex optical arrangement may be used to form a low-aberration image of the desired apparent size at the user's eye.

The direction of polarization of the analyzer 21 is aligned parallel to the direction of polarization of the polarizer 17 so that light whose direction of polarization has not been rotated by the spatial light modulator will pass through the analyzer to the user's eye E, and light whose direction of polarization has been rotated through 90 DEG by the spatial light modulator will not pass through the analyzer. Thus, the analyzer prevents light whose direction of polarization has been rotated by the spatial light modulator from reaching the user's eye. Consequently, the spatial light modulator will appear light or dark to the user depending on the applied electric field. When the spatial light modulator appears light, it will be said to be in its ON state, and when the spatial light modulator appears dark, it will be said to be in its OFF state. The direction of polarization of the analyzer can alternatively be arranged orthogonal to that of the polarizer. In this case, the spatial light modulator operates in the opposite sense to that just described. This enables a positive picture to be obtained by illuminating the spatial light modulator during a balance period.

The optical arrangement shown in FIG. 1 may also form the basis of a full-size video or graphics display. Such a full-size color display device, (e.g., having a nominal diagonal dimension of 430 mm) can be made by increasing the intensity of the light source 15 and by replacing the eyepiece 23 with magnifying optics that form an image of the reflective electrode 35 on a suitable screen. A single spatial light modulator sequentially illuminated by light of the three primary colors, or parallel spatial light modulators, each illuminated by light of a different primary color, can be used in a full-size color display device.

FIG. 1 additionally shows some details of the spatial light modulator 100. The spatial light modulator is composed of the electro-optical layer 31 sandwiched between the common electrode 33 and the reflective electrode 35. The electrode 33 is transparent and is deposited on the surface of the transparent cover 37. The electrode 35 is located on the surface of the semiconductor substrate 39. As will be discussed below primarily in connection with FIGS. 3–5, the single-ended voltage amplifier of the present invention provides pixel drive voltage for electro-optical layer 31.

An electro-optical material is a material having an optical property that depends on an applied electric field. For example, in the optical arrangement shown in FIG. 1, the rotation of the direction of polarization of light impinging on the electro-optical layer depends on the direction of an electric field applied to the layer. In other electro-optical materials, rotation of the direction of polarization may depend on the strength of the electric field applied to the layer. The transmissivity of other electro-optical materials may depend on the electric field applied to the layer.

In the preferred embodiment, the electro-optical material is a ferroelectric liquid crystal material. The direction of the electric field applied between the transparent electrode 33 and the reflective electrode 35 determines whether the direction of polarization of light impinging on the ferroelectric material sandwiched between the electrodes is rotated or not. In other embodiments, a conventional nematic liquid crystal may be used as the electro-optical material. In this case, the strength of the electric field between the electrodes determines whether the direction of polarization is rotated or not.

To enable the display device 10 to display an image instead of merely controlling the passage of light from the light source 15 to the user's eye E, the reflective electrode 35 is divided into a two-dimensional array of pixel electrodes, exemplary ones of which are shown at 118. In addition, a drive circuit (114 in FIG. 2A) that drives the pixel electrode is located in the substrate 39 under each pixel electrode. The drive circuit, the pixel electrode and the portions of the electro-optical layer 31 and the common electrode 33 overlaying the pixel electrode collectively constitute a pixel, an exemplary one of which is shown at 112.

When the electro-optical layer 31 is composed of a ferroelectric material, the direction of the electric field applied between each pixel electrode, such as the pixel electrode 118, and the common electrode 33 determines whether the direction of polarization of the light reflected by the pixel electrode is rotated through 90 DEG or not, and thus whether the corresponding pixel, such as the pixel 112, will appear bright or dark to the user. When the pixel appears light, the pixel will be said to be in its ON state, and when the pixel appears dark, the pixel will said to be in its OFF state.

The optical characteristics of the pixels of the spatial light modulator 100 may be binary: light from the light source 15 and reflected by the pixel either passes through the analyzer 21 to the user's eye E or does not pass through the analyzer to the user's eye. To produce a grey scale, the apparent brightness of each pixel is varied by temporally modulating the light that reaches the user's eye. The light is modulated by choosing a basic time period that will be called the illumination period of the spatial light modulator. The spatial light modulator is illuminated through the illumination period, and each pixel is set to its ON state for a first temporal portion of the illumination period, and to its OFF state for a second temporal portion. The second temporal portion constitutes the remainder of the illumination period, and is thus complementary to the first temporal portion. Alternatively, the OFF state may precede the ON state. The fraction of the illumination period constituted by the first temporal portion, during which the pixel is in its ON state, determines the apparent brightness of the pixel.

Alternatively, this invention may also be used when non-binary modulators (as are often found with nematic LC) are used.

The principles just described may be extended to enable the spatial light modulator to generate a color image. In this case, the spatial light modulator is driven by the color components of a color video signal, and three display periods are defined for each frame of the color video signal, one for each color component. The light source 15 illuminates the spatial light modulator with light of a different color during the illumination period of each display period. Each pixel is set to its ON state for a fraction of each of the three illumination periods, and to its OFF state for the remainder of the illumination period. The fraction of each of the three illumination periods in which the pixel is in its ON state determines the apparent saturation and hue of the pixel. The display periods of a color display may each correspond to one-third of the frame period of the color video signal, for example. Making the display period the same for the three color components is operationally convenient, but is not essential.

Figure 2A:
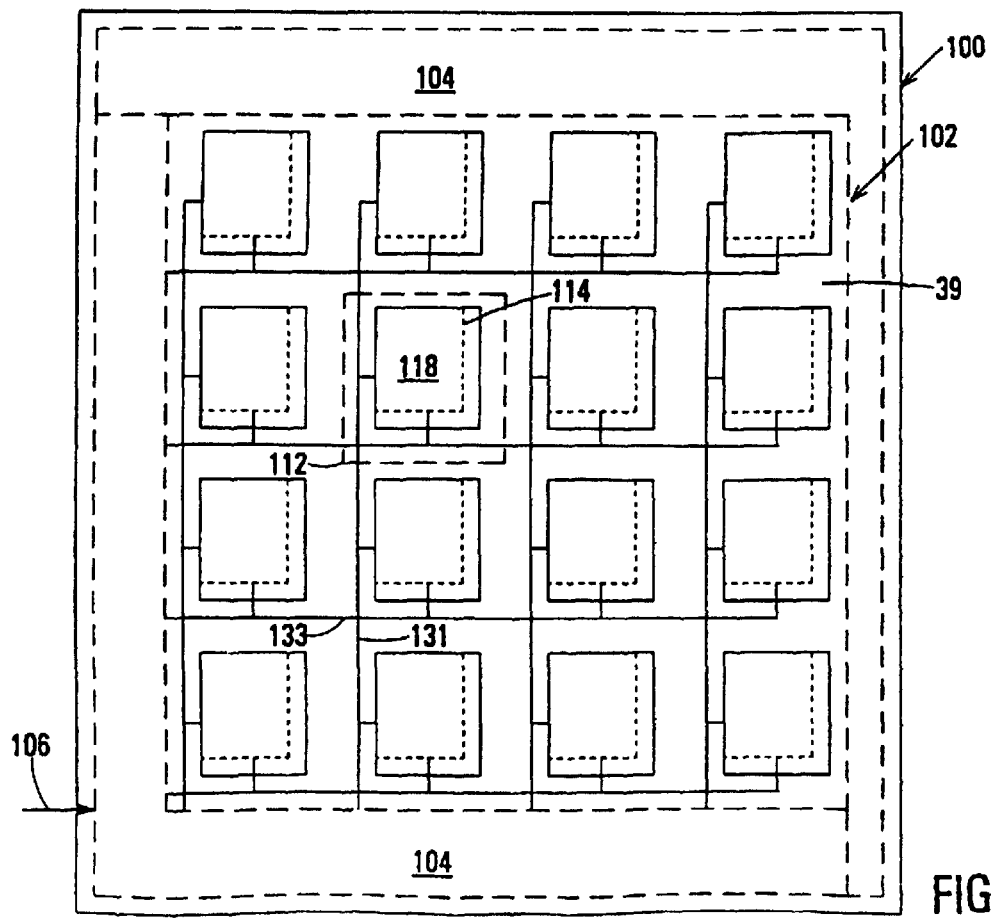
FIGS. 2A–2D show details of the spatial light modulator of the display device shown in FIG. 1.
Figure 2B:
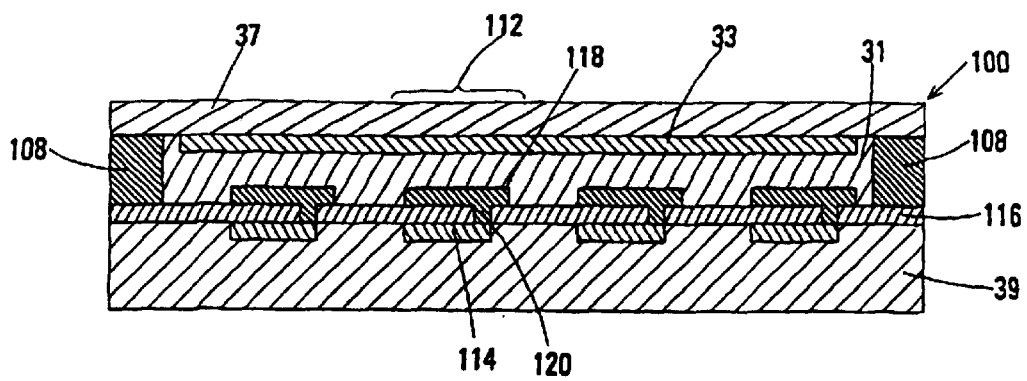

The spatial light modulator 100 will now be described in more detail with reference to FIGS. 2A–2D. Referring first to FIGS. 2A and 2B, the light modulator is composed of the electro-optical layer 31 sandwiched between the transparent cover 37 and the semiconductor substrate 39. The transparent cover, which may be a thin glass plate, for example, is separated from the substrate by the spacers 108. The translucent common electrode 33, which may be a layer of indium tin oxide (ITO), for example, is located on the inside surface of the transparent cover, facing the substrate.

An array 102 of pixels is located on the surface of the substrate 39. The exemplary pixel is shown at 112. The drawings throughout this disclosure show pixel arrays with only four pixels in each dimension to simplify the drawings. In a practical embodiment, the pixel array would be composed of, for example, 640×480, 800×600 pixels, 1280×1024 pixels, 2044×1125 pixels, or some other acceptable two-dimensional arrangement of pixels.

For each pixel in the pixel array 102, a drive circuit is formed by conventional semiconductor processing on and under the surface of the substrate 39. The analog drive circuit of the exemplary pixel 112 is shown at 114. The analog drive circuit is composed of transistors, capacitors and other circuit elements (not shown) interconnected by one or more layers of conductors (not shown). The analog drive circuits of the pixels constituting the pixel array 102 are connected to one another and to pads through which external electrical connections are made by additional layers of conductors (not shown). The surface of the substrate, and the above-mentioned layers of conductors, are covered by the insulating layer 116. The reflective pixel electrode 118 of the pixel 112 is located on the surface of the insulating layer overlaying the analog drive circuit. The pixel electrode is connected to the output of the analog drive circuit 114 by the conductor 120 which passes through an aperture formed in the insulating layer.

In the pixel 112, the analog drive circuit 114 generates a drive signal that is applied to the pixel electrode 118. The drive signal applied to the electrode has a 1 state and a 0 state. The 1 state may be a high voltage state, and the 0 state may be a low voltage state, for example. The state of the drive signal applied to the pixel electrode determines whether or not the portion of the electro-optical layer 31 overlaying the pixel electrode rotates the direction of polarization of light falling on the pixel, as described above. The analog drive circuit sets the apparent brightness of the pixel by applying the drive signal to the pixel electrode in response to an analog sample derived from a video signal. During each above-described illumination period the drive signal starts in one state, corresponding to the ON state of the pixel, for example, and remains there for the first temporal portion. Before the end of the illumination period, the drive signal switches to the other state and remains there for the second temporal portion. The fraction of the illumination period for which the pixel is in its ON state determines the apparent brightness of the pixel. When the video signal is a color video signal, the analog drive circuit sets the apparent saturation and hue of the pixel by applying drive signals that turn the pixel ON for fractions of three consecutive illumination periods that depend on the three color components of the color video signal.

FIG. 2A shows the pixels arranged in the two-dimensional pixel array 102 on the surface of the substrate 39. The sample derivation and distribution circuit 104 is also formed in the substrate 39. This circuit distributes samples derived from the video signal received via the video input 106 to the pixel array and generates the various timing and control signals required by the pixel array. Signals are distributed from the sample derivation and distribution circuit to the pixels by busses, representative ones of which are shown schematically at 131 and 133.

Figure 2C:
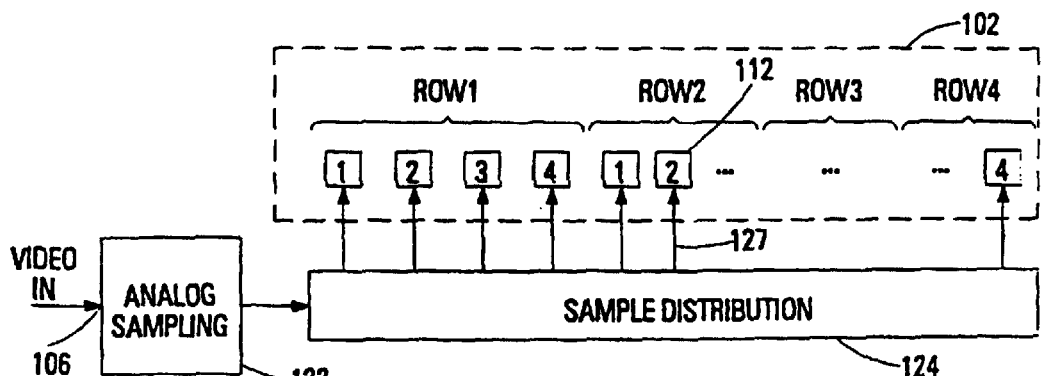

FIG. 2C is schematic representation of the electrical arrangement of the spatial light modulator 100. The sampling circuit 122 receives a video signal via the video input 106 and derives a stream of samples from the video signal. The samples are distributed to the pixels constituting the pixel array 102 by the sample distribution circuit 124. Each pixel receives at least one sample of each frame of the video signal. The location in the frame of the video signal whence the sample is derived corresponds to the location of the pixel in the pixel array.

Figure 2D:
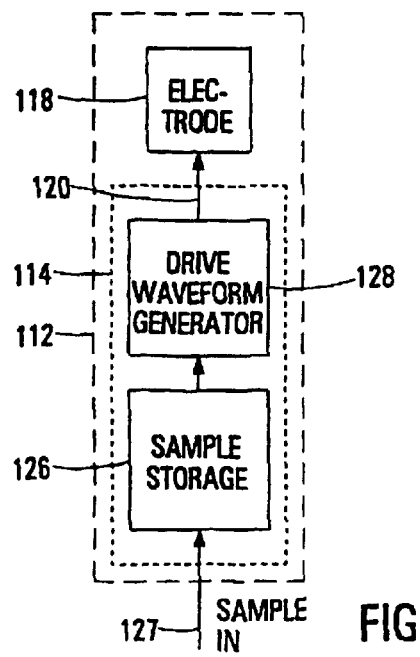

FIG. 2D is a schematic representation of the electrical arrangement of the pixel 112 in the two-dimensional pixel array 102. The remaining pixels have the same electrical arrangement. The pixel is composed of the drive circuit 114, the output of which is connected to the electrode 118 by the conductor 120. The drive circuit is composed of the sample selection section 126, and the drive signal generator 128. The sample selection section has a sample input 127 connected to the sample distribution circuit 124 (FIG. 2C). During each frame of the video signal, the sample selection section receives a sample derived from the video signal via the sample input and temporarily stores the sample until the sample is needed by the drive signal generator 128.

The drive signal generator 128 receives each sample stored in the sample selection section 126 during the picture period of the previous frame and, in response to the sample, generates a drive signal and applies the drive signal to the electrode 118. The drive signal generator generates the drive signal with a period corresponding to the above-described display period.

The display period of each frame begins immediately after the end of the display period of the previous frame. In some embodiments, the drive waveform is generated intermittently, and a period in which the drive signal is generated in a neutral state is interposed between consecutive display periods.

The waveforms just described are those required to drive a electro-optical material that lacks a bistable characteristics. However, it will be apparent to a person of ordinary skill in the art that circuits for generating such waveforms can easily be adapted to generate the waveforms required to drive a bistable electro-optical material. For example, a drive circuit capable of generating the waveforms just described can be adapted to drive a bistable electro-optical material by capacitatively or a.c. coupling the output of the circuit to the pixel electrode.

Figure 3:
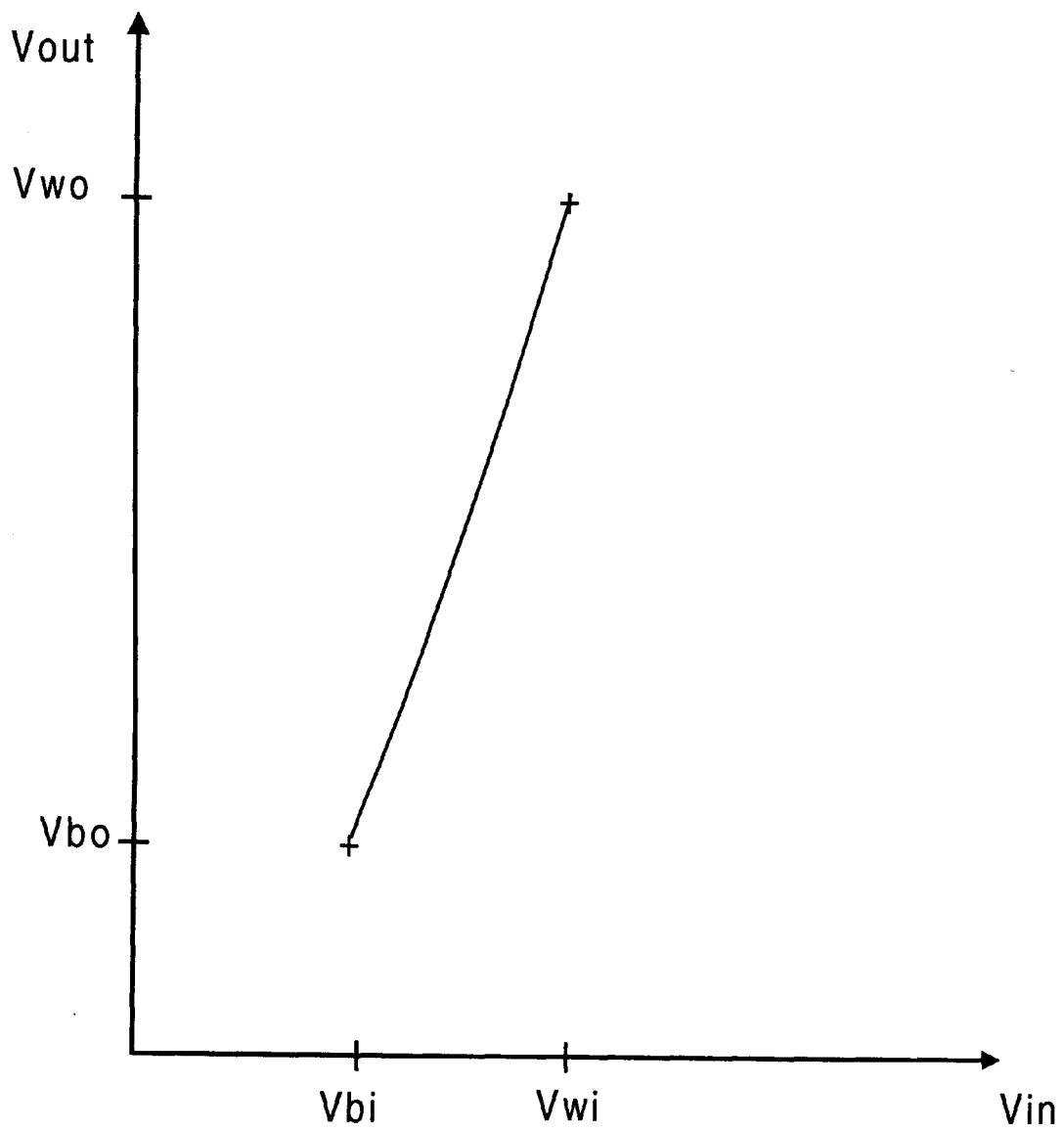
FIG. 3 is a diagram illustrating a linear transfer function of a voltage amplifier to drive the pixels of the spatial light modulator for a liquid crystal display according to the present invention.

FIG. 3 is a diagram illustrating a linear transfer function of a voltage amplifier to drive the pixels of the spatial light modulator for a liquid crystal display according to the present invention. For one embodiment, voltage amplifiers of the present invention drive the pixel array of a micro display through buffers with an analog signal (which can be customized for a particular range of voltages). For one embodiment, the micro display requires approximately Vout=0.4 to 2.1 volts and therefore the pixels need a 1.7 volt swing from black-to-white. FIG. 3 shows a desired linear relationship between voltage input to the voltage amplifier (Vin of the horizontal axis) and voltage output from the voltage amplifier (Vout of the vertical axis).

Ideally, as input voltage Vin is increased from black Vbi to white Vwi, output voltage Vout will increase linearly from black Vbo to white Vbo. This linear relationship can be expressed in slope intercept form as:

Vout=$m$ Vi+b;

where m is the slope (gain), of the amplifier and b is the intercept of the Vout axis, (offset).
Solving for gain and offset yields:

$$m = \frac{Vwo - Vbo}{Vwi - Vbi} \quad \text{(gain)}$$

$$b = Vbo - mVbi \quad \text{(offset)}$$

Figure 4:
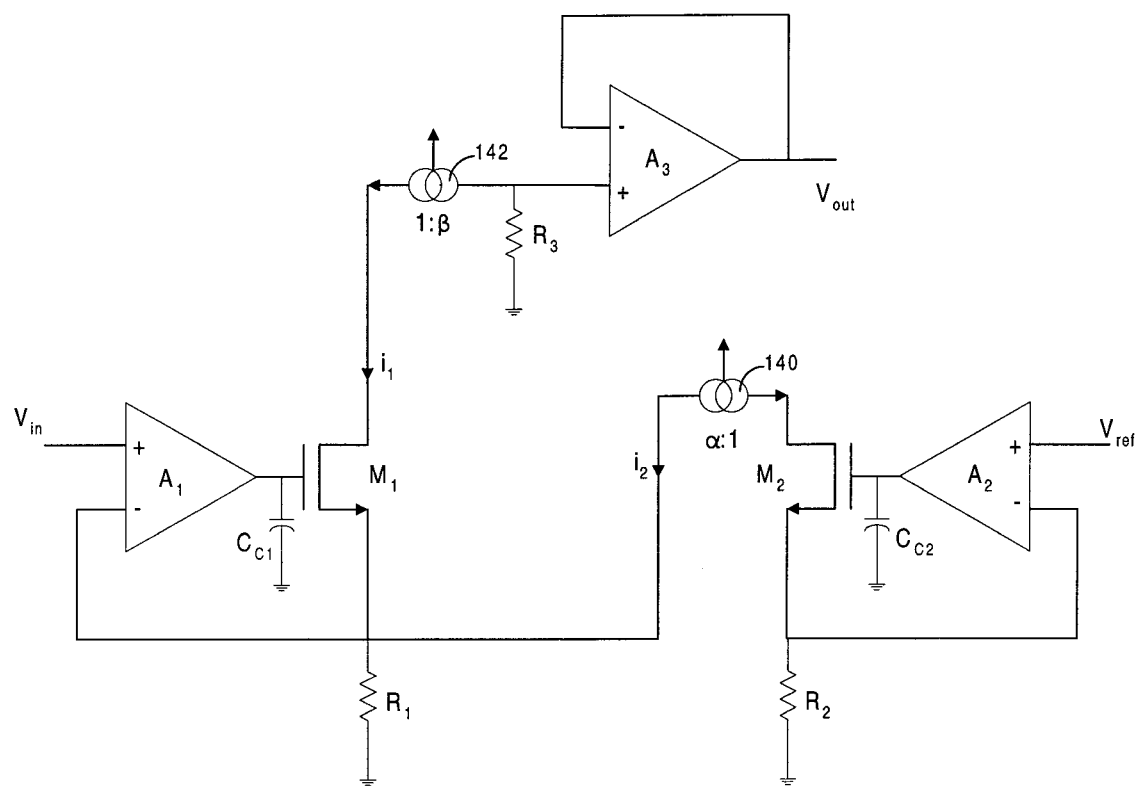
FIG. 4 is a diagram illustrating a low power single-ended voltage amplifier with adjustable gain and offset having a minimum number of operational transconductance amplifiers according to the present invention.

FIG. 4 is a diagram illustrating a low power single-ended voltage amplifier with adjustable gain and offset having a minimum number of operational transconductance amplifiers according to the present invention. This circuit amplifies a single-ended voltage input and shifts the offset of the output to a stable voltage as was quantitatively described in FIG. 3.

Amplifiers $A_1$ and A2 are operational transconductance amplifiers (OTAs). Transconductance, also called mutual conductance, is the ratio of a change in output current to the change in input voltage that caused it. OTAs and current mirrors (such as current mirrors 140 and 142) are commonly found in VLSI libraries for modern digital CMOS processes. Current mirrors have the property that the output current is equal to a constant times the input current.

In FIG. 4, capacitors Cc1 and Cc2 provide frequency compensation. Amplifier $A_3$ is a unity-gain voltage buffer and Vref is a stable DC voltage. Analysis of the circuit of FIG. 4 yields Eq 1.

$$Vout = \left(\beta \cdot \frac{R_3}{R_1}\right) Vin - \alpha\beta\left(\frac{R_3}{R_2}\right) Vout \quad \text{(Eq 1)}$$

Thus, Vout=m·Vi+b; where $$m = \beta\left(\frac{R_3}{R_1}\right) \quad \text{(gain)}$$

$$b = -\alpha\beta\left(\frac{R_3}{R_2}\right) Vref \quad \text{(offset)}$$

The circuit of FIG. 4 is easily adjustable. For one embodiment, the values of α, β, $R_3$, and Vref are fixed. $R_1$ and $R_2$ are then chosen to realize the desired gain and offset.

$$R_1 = \left(\frac{\beta}{m}\right) R_3 \quad \text{(Eq 2)}$$

$$R_2 = \left(\frac{-\alpha\beta\,Vref}{b}\right) R_3 \quad \text{(Eq 3)}$$

With the resistance values of equations 2 and 3, the current $i_1$ is:

$$i_1 = \left(\frac{1}{\beta R_3}\right) Vout \quad \text{[Eq 4]}$$

In the present invention, the resistors may be off-chip resistors, or on-chip resistors.

Advantages of the Invention

Because OTAs are simple to implement in modern digital CMOS processes, this invention can easily be integrated on a chip with digital logic. Prior art approaches such as Allen's bipolar circuit makes this impossible or prohibitively expensive.

The bandwidth of the amplifier is determined by the frequency response of the OTAs. It is independent of gain. This is a common feature of current-mode circuits. This is also an efficient use of power for variable-gain applications.

The integrated current mirrors provide fine-grain control of the gain. One can inexpensively realize any non-integer gain by choosing a non-integer β and standard resistance values for $R_1$ and $R_3$. For example, setting $R_1=R_3$ and β to 3.14159 realizes a nominal gain of π. One can also choose α to provide fine-grain control of the offset. Furthermore, using standard values for the resistors saves system cost.

Suppose one desired to tune the circuit to achieve a fixed output swing with a variable input swing. Equation 4 shows that the current $i_1$ will remain constant. This is a consequence of subtracting current $i_2$ at the source of $M_1$. Trying to adjust the offset by injecting current into $R_3$ would not result in a constant $i_1$. Thus, $i_1$ being constant permits one to optimize the frequency response of the AC signal path. It can also reduce the dependency of the power dissipation on the overall gain.

Figure 5:
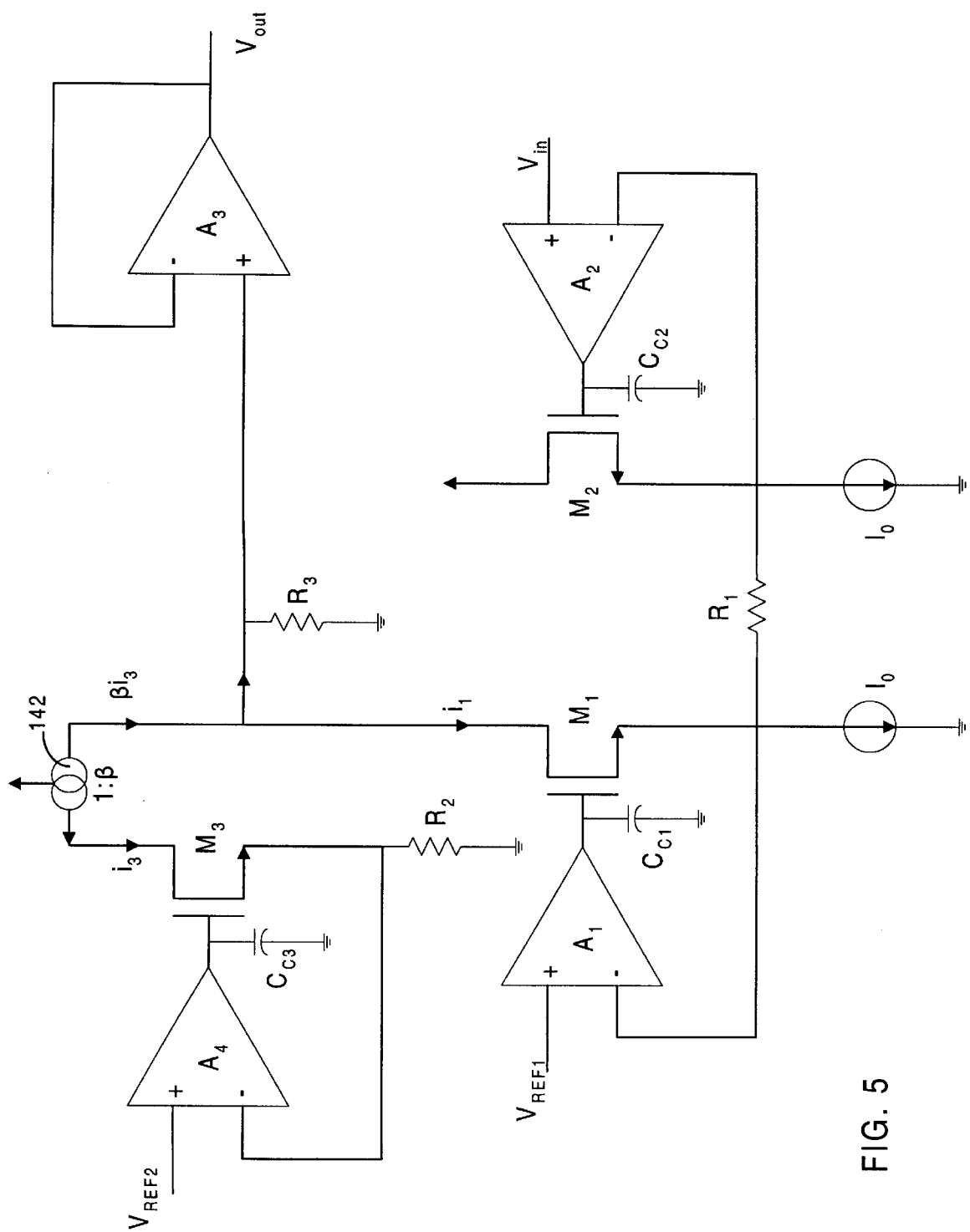
FIG. 5 is a diagram illustrating a low power single-ended voltage amplifier with adjustable gain and offset according to an alternative embodiment of the present invention.

FIG. 5 is a diagram illustrating a low power single-ended voltage amplifier with adjustable gain and offset according to an alternative embodiment of the present invention. Typically, the circuit of FIG. 4 would be simpler and cheaper to implement than the circuit described in FIG. 5, but the circuit of FIG. 5 will also provide a low power single-ended voltage amplifier with adjustable gain and offset and may be preferable under certain conditions.

The circuits of FIGS. 4 and 5 both represent voltage amplifiers having the same basic topology of a voltage-to-current converter, a current follower and a voltage buffer. In FIG. 4, amplifiers $A_1$ and $A_2$ together form a voltage-to-current amplifier and part of the current follower. FIG. 5 has an additional operational transconductor amplifier, A4, which forms part of the current follower. Amplifiers $A_1$ and $A_2$ together form a differential voltage-to-current amplifier (with $Vref_1$ and Vin providing the differential inputs) in FIG. 5, Thus, FIG. 5 shows a voltage gain/offset cell with floating resistor $R_1$.

Analysis of the circuit of FIG. 5 shows that $$Vout = \left(\frac{R_3}{R_1}\right)Vin - R_3\left(I_0 + \frac{Vref_1}{R_1} + \frac{\beta}{R_2}Vref_2\right) \quad [Eq\ 5]$$

Therefore, the gain and offset are (respectively):

$$m = \frac{R_3}{R_1} \quad [Eq\ 6]$$

$$b = -R_3\left(I_0 + \frac{Vref_1}{R_1} - \frac{\beta Vref_2}{R_2}\right) \quad [Eq\ 7]$$

Note that the equation for b (i.e., offset) is more complex than that found in Eq 3. Also, in order to keep the AC signal-path current constant, $R_3$ cannot be constant. This property makes the circuit of FIG. 4 easier to tune than the circuit of FIG. 5.

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A voltage amplifier, comprising:
   a voltage-to-current converter;
   a voltage buffer; and
   a current follower coupled between the voltage-to-current converter and the voltage buffer, the voltage amplifier employing operational transconductance amplifiers and at least one current mirror to achieve a fixed output swing of an output voltage from the voltage buffer based upon an input swing of a single-ended input voltage to the voltage-to-current converter,
   wherein a marginal change in the output voltage from the output buffer is substantially linear and proportional to a marginal change in the input voltage input to the voltage-to-current converter, and the gain and voltage offset of the output voltage can be adjusted by changing the values of two resistors.

2. The voltage amplifier as set forth in claim 1, wherein the two resistors are off-chip resistors.

3. A spatial light modulator, comprising:
   an array of pixels; and
   an analog driver for at least one of the pixels of the array of pixels, the analog driver having a voltage amplifier as set forth in claim 1.

4. A display device having the modulator of claim 3.

5. A voltage amplification method, comprising:
   voltage-to-current conversion using a voltage-to-current converter; voltage buffering using a voltage buffer; and
   current following using a current follower coupled between the voltage-to-current converter and the voltage buffer, the voltage amplifier employing operational transconductance amplifiers and at least one current mirror to achieve a fixed output swing of an output voltage from the voltage buffer based upon an input swing of a single-ended input voltage to the voltage-to-current converter, wherein a marginal change in the output voltage from the voltage buffer is substantially linear and proportional to a marginal change in the input voltage input to the voltage-to-current converter, and
   wherein gain and voltage offset of the output voltage can be adjusted by changing the values of two resistors.

6. The voltage amplification method as set forth in claim 5, wherein the two resistors are off-chip resistors.

* * * * *